(12) United States Patent
Minoura et al.

(10) Patent No.: US 9,035,414 B2
(45) Date of Patent: May 19, 2015

(54) COMPOUND SEMICONDUCTOR DEVICE AND MANUFACTURING METHOD THEREOF

(71) Applicant: FUJITSU LIMITED, Kawasaki-shi, Kanagawa (JP)

(72) Inventors: Yuichi Minoura, Zama (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/930,352

(22) Filed: Jun. 28, 2013

(65) Prior Publication Data

US 2013/0292790 A1    Nov. 7, 2013

Related U.S. Application Data

(63) Continuation of application No. PCT/JP2011/050676, filed on Jan. 17, 2011.

(51) Int. Cl.
*H01L 29/47* (2006.01)
*H01L 21/28* (2006.01)
*H01L 21/44* (2006.01)
(Continued)

(52) U.S. Cl.
CPC .......... *H01L 29/872* (2013.01); *H01L 27/0814* (2013.01); *H01L 27/095* (2013.01); *H01L 29/2003* (2013.01); *H01L 29/417* (2013.01); *H01L 29/42316* (2013.01); *H01L 29/475* (2013.01); *H01L 29/66462* (2013.01); *H01L 29/7787* (2013.01); *H01L 29/66143* (2013.01); *H01L 21/2654* (2013.01); *H01L 29/66196* (2013.01); *H01L 2224/32245* (2013.01);
(Continued)

(58) Field of Classification Search
CPC ..... H01L 29/473; H01L 29/475; H01L 29/45; H01L 29/452; H01L 29/47; H01L 29/4966; H01L 29/872; H01L 29/66196; H01L 29/7787; H01L 29/42316; H01L 29/66462; H01L 29/417
USPC .......................................................... 257/472
See application file for complete search history.

(56) References Cited

U.S. PATENT DOCUMENTS 6,768,146 B2     7/2004   Yoshida
2010/0078683 A1  4/2010   Baba
2013/0214287 A1* 8/2013   Okamoto et al. ............... 257/76

FOREIGN PATENT DOCUMENTS

JP    H60-157268       8/1985
JP    2002-334998 A1   11/2002
(Continued)

OTHER PUBLICATIONS

WO 2012/003609 A1 PCT Publication Jan. 12, 2012.*
(Continued)

*Primary Examiner* — William D Coleman
(74) *Attorney, Agent, or Firm* — Kratz, Quintos & Hanson, LLP

(57) ABSTRACT

A semiconductor device includes a semiconductor layer and a Schottky electrode, a Schottky junction being formed between the semiconductor layer and the Schottky electrode. The Schottky electrode includes a metal part containing a metal, a Schottky junction being formed between the semiconductor layer and the metal part; and a nitride part around the metal part, the nitride part containing a nitride of the metal, and a Schottky junction being formed between the semiconductor layer and the nitride part.

20 Claims, 13 Drawing Sheets

(51) Int. Cl.
*H01L 29/872* (2006.01)
*H01L 27/08* (2006.01)
*H01L 29/417* (2006.01)
*H01L 29/423* (2006.01)
*H01L 29/66* (2006.01)
*H01L 29/778* (2006.01)
*H01L 27/095* (2006.01)
*H01L 29/20* (2006.01)
*H01L 21/265* (2006.01)

(52) U.S. Cl.
CPC .......... *H01L2224/45124* (2013.01); *H01L 2224/48247* (2013.01); *H01L 2224/73265* (2013.01)

(56) References Cited

FOREIGN PATENT DOCUMENTS

| JP | 2004-31896 A1 | 1/2004 |
| JP | 2007-48842 A1 | 2/2007 |
| JP | 2008-235709 A1 | 10/2008 |
| JP | 2010-87274 A1 | 4/2010 |

OTHER PUBLICATIONS

International Search Report for International Application No. PCT/JP2011/050676 dated Apr. 5, 2011.

\* cited by examiner

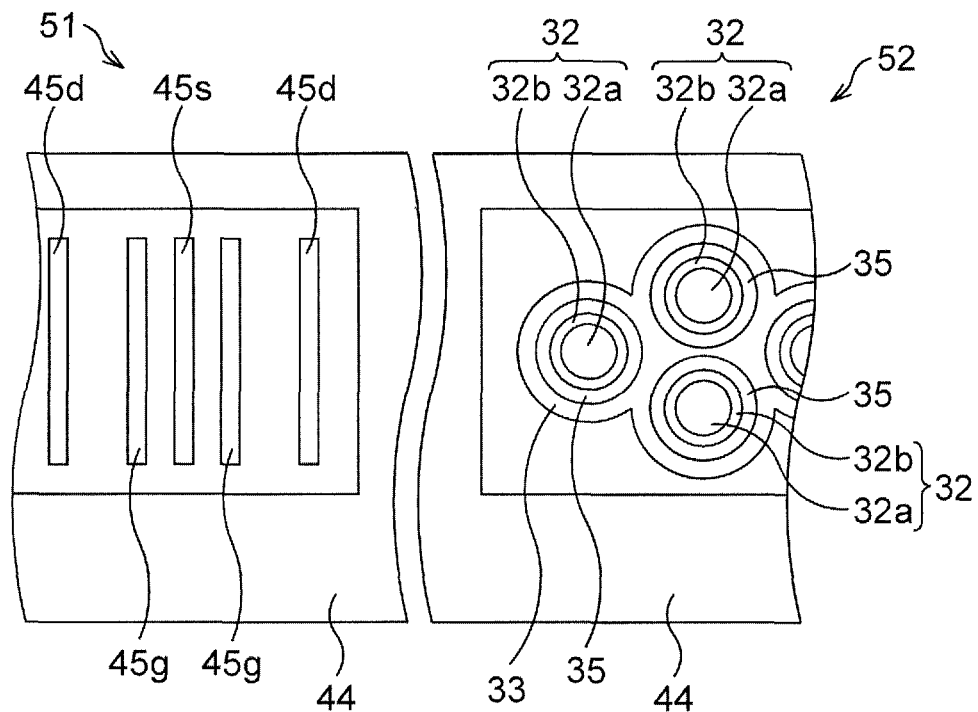
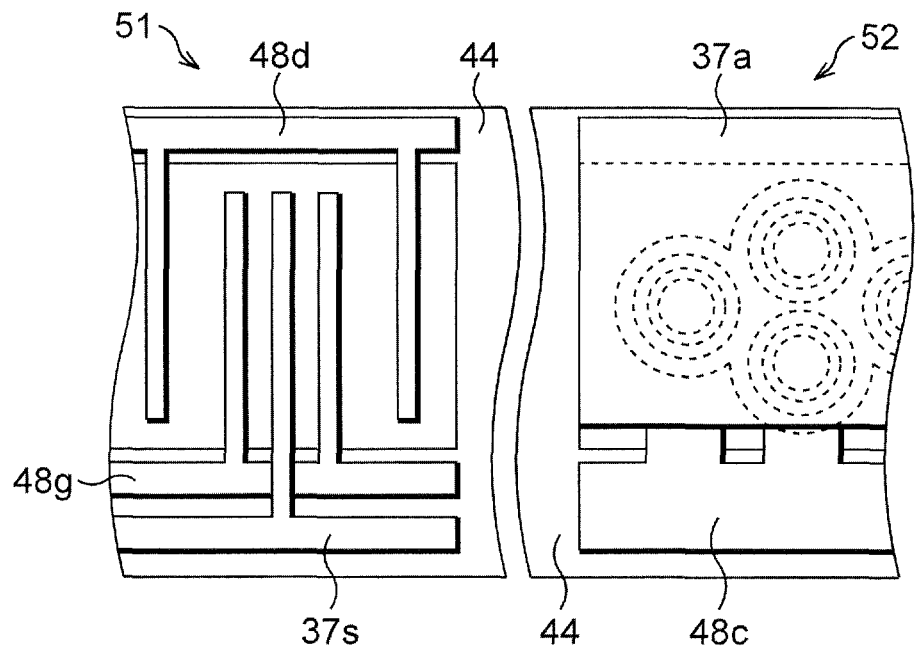

COMPOUND SEMICONDUCTOR DEVICE AND MANUFACTURING METHOD THEREOF

CROSS-REFERENCE TO RELATED APPLICATION

This application is a continuation application of International Application PCT/JP2011/050676 filed on Jan. 17, 2011 and designated the U.S., the entire contents of which are incorporated herein by reference.

FIELD

The embodiments discussed herein are related to a semiconductor device and a manufacturing method thereof.

BACKGROUND

GaN, which is a compound semiconductor with a wide band gap, has promise as a material for a device capable of fast operation with a high breakdown voltage because of its physical property and is expected to be applied, in particular, to a power supply apparatus which operates with a high breakdown voltage and a large current. Further, a Schottky barrier diode (SBD) is superior to a pn diode in terms of faster responsiveness and lower loss. Therefore, an SBD using GaN (GaN-based SBD) is expected as a low consumption power supply apparatus of the next generation.

To decrease a loss of a GaN-based SBD, it is important to decrease the on-voltage of the SBD. Further, to decrease the on-voltage, it is effective to use a metal with low work function for the anode electrode. This is because a Schottky barrier height at an interface between a metal and a compound semiconductor is decreased to lower a forward voltage. On the other hand, a metal with low work function thins the depletion layer occurring when a reverse bias is applied, resulting in difficulty in obtaining a sufficient off-breakdown voltage. As described above, it is difficult to balance a low on-voltage with a high off-breakdown voltage.

Relating to the balance between a low on-voltage and a high off-breakdown voltage, a structure of an anode electrode in which a metal with a small Schottky barrier height is used with a metal with a large Schottky barrier height formed around the former metal is proposed. To form the anode electrode, however, it is necessary to form one of the metals and then form and pattern the other metal. Therefore, a chemical or the like used for cleaning of a surface of a compound semiconductor is limited, and it is difficult to perform sufficient cleaning on an interface between a metal and a compound semiconductor. Consequently, a Schottky characteristic decreases and/or a yield of the device decreases.

Patent Literature 1: Japanese Laid-open Patent Publication No. 2004-31896

SUMMARY

According to an aspect of the embodiments, a semiconductor device includes: a semiconductor layer; and a Schottky electrode, a Schottky junction being formed between the semiconductor layer and the Schottky electrode. The Schottky electrode includes: a metal part containing a metal, a Schottky junction being formed between the semiconductor layer and the metal part; and a nitride part around the metal part, the nitride part containing a nitride of the metal, and a Schottky junction being formed between the semiconductor layer and the nitride part.

According to another aspect of the embodiments, a power supply apparatus includes a semiconductor device. The semiconductor device includes: a semiconductor layer; and a Schottky electrode, a Schottky junction being formed between the semiconductor layer and the Schottky electrode. The Schottky electrode includes: a metal part containing a metal, a Schottky junction being formed between the semiconductor layer and the metal part; and a nitride part around the metal part, the nitride part containing a nitride of the metal, and a Schottky junction being formed between the semiconductor layer and the nitride part.

According to another aspect of the embodiments, a manufacturing method of a semiconductor device includes: forming a metal film, a Schottky junction being formed between a semiconductor layer and the metal film; and nitriding a peripheral portion of the metal film to form a metal part and a nitride part around the metal part from the metal film, a Schottky junction being formed between the semiconductor layer and the metal part, and a Schottky junction being formed between the semiconductor layer and the nitride part.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8A is a view illustrating a layout of electrodes;

FIG. 8B is a view illustrating a layout of wirings;

DESCRIPTION OF EMBODIMENTS

Hereinafter, embodiments will be concretely described referring to the accompanying drawings.

(First Embodiment)

Figure 1A:
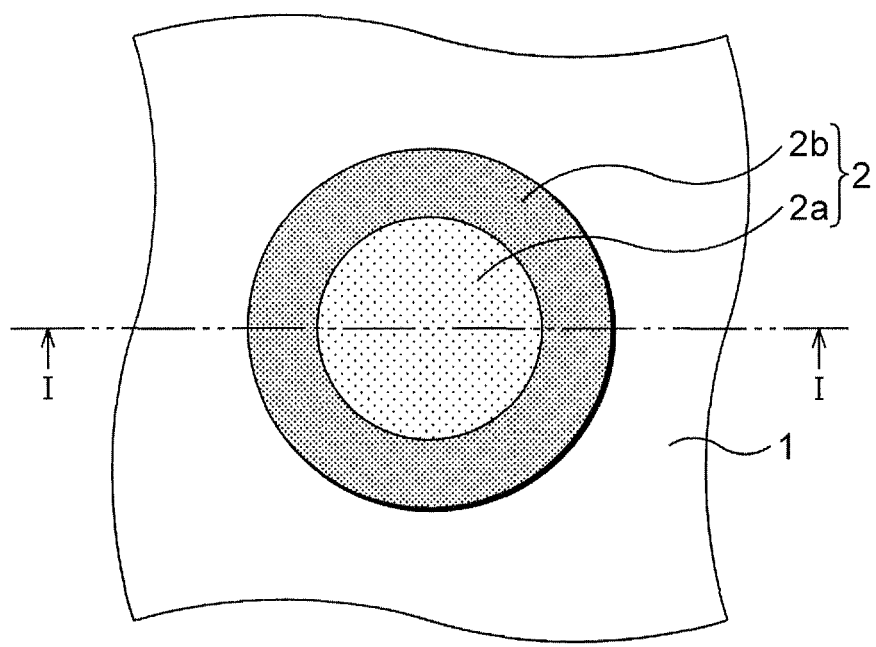
FIG. 1A is a plan view illustrating a structure of a semiconductor device according to a first embodiment.

First, a first embodiment will be described. FIG. 1A is a plan view illustrating a structure of a semiconductor device (Schottky barrier diode) according to the first embodiment, and FIG. 1B is a sectional view along a line I-I in FIG. 1A.

Figure 1B:
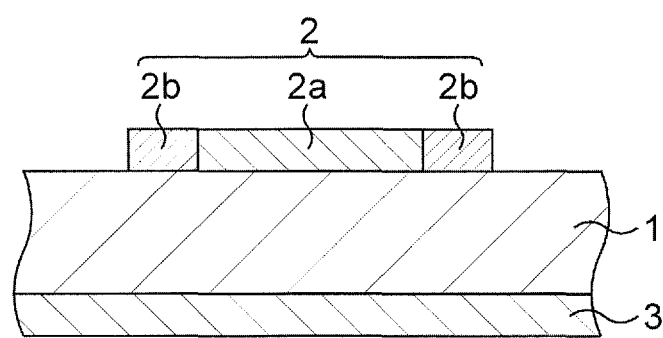
FIG. 1B is a sectional view along a line I-I in FIG. 1A.

As illustrated in FIG. 1A and FIG. 1B, a Schottky electrode 2 is formed over a semiconductor layer 1 in the first embodiment. An ohmic electrode 3 is formed on a rear surface of the semiconductor layer 1. The Schottky electrode 2 includes a metal film 2a containing a metal and a nitride film 2b around the metal film 2a. A Schottky junction is formed between the semiconductor layer 1 and the metal film 2a, and a Schottky junction is formed between the semiconductor layer 1 and the nitride film 2b. The nitride film 2b contains a nitride of the metal contained in the metal film 2a. In other words, the nitride film 2b contains a substance lower in work function than a substance contained in the metal film 2a.

Figure 2A:
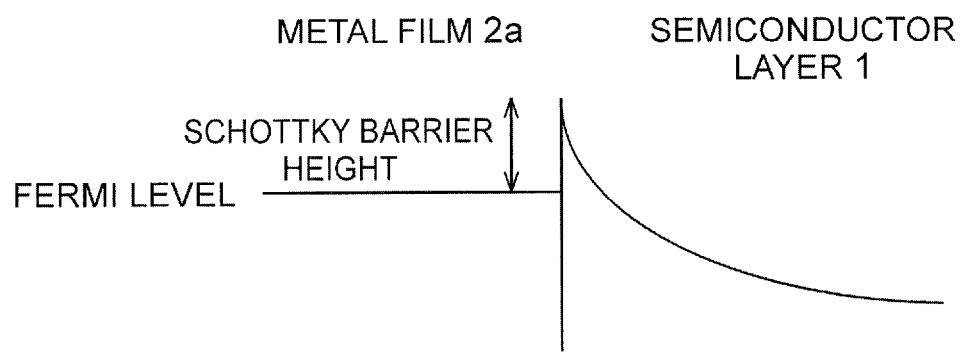
FIG. 2A is a diagram illustrating a relation between conduction bands in a metal film and a semiconductor layer in the first embodiment.
Figure 2B:
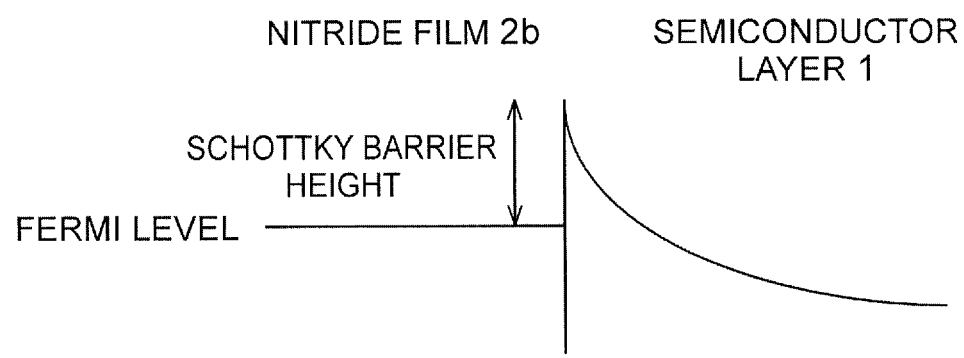
FIG. 2B is a diagram illustrating a relation between conduction bands in a nitride film and the semiconductor layer in the first embodiment.

In the first embodiment configured as described above, there is difference in work function between the metal film 2a and the nitride film 2b, so that a Schottky barrier height between the nitride film 2b and the semiconductor layer 1 is higher than a Schottky barrier height between the metal film 2a and the semiconductor layer 1, as illustrated in FIG. 2A and FIG. 2B. Accordingly, when a forward bias is applied, current flows between the metal film 2a and the semiconductor layer 1 earlier than between the nitride film 2b and the semiconductor layer 1. Therefore, as the work function of the metal film 2a is lower, a forward voltage is lower and an on-voltage is lower. Further, when a reverse bias is applied, a depletion layer widely spreads in the semiconductor layer 1 from the nitride film 2b to cause pinch-off. Therefore, even when the work function of the metal film 2a is low, a sufficient off-breakdown voltage can be obtained. In short, according to the first embodiment, the low on-voltage and the high off-breakdown voltage are compatible. Further, since the nitride film 2b may be formed by nitridation of the same material as that of the metal film 2a, it is possible to avoid a decrease in cleanliness in a case of combining two kinds of metals. Accordingly, high reliability can also be ensured.

Note that each percentage of the metal film 2a and the nitride film 2b in the Schottky electrode 2 is not limited in particular, and that the area of the metal film 2a is preferably larger than the area of the nitride film 2b in a plan view.

(Second Embodiment)

Figure 3A:
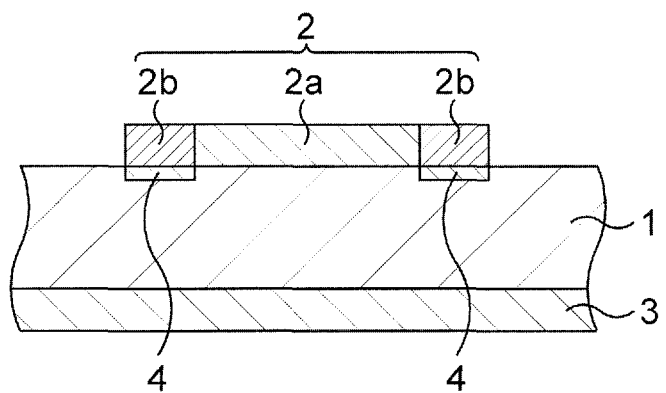
FIG. 3A is a sectional view illustrating a structure of a semiconductor device according to a second embodiment.

Next, a second embodiment will be described. FIG. 3A is a sectional view illustrating a structure of a semiconductor device (Schottky barrier diode) according to the second embodiment, illustrating a section taken along a line I-I in FIG. 1A.

In the second embodiment, a high resistance region 4 is formed at a portion of the semiconductor layer 1 in contact with the nitride film 2b, as illustrated in FIG. 3A. A resistance of the high resistance region 4 is higher than a resistance of a portion of the semiconductor layer 1 in contact with the metal film 2a. The other configuration is the same as that of the first embodiment.

Figure 3B:
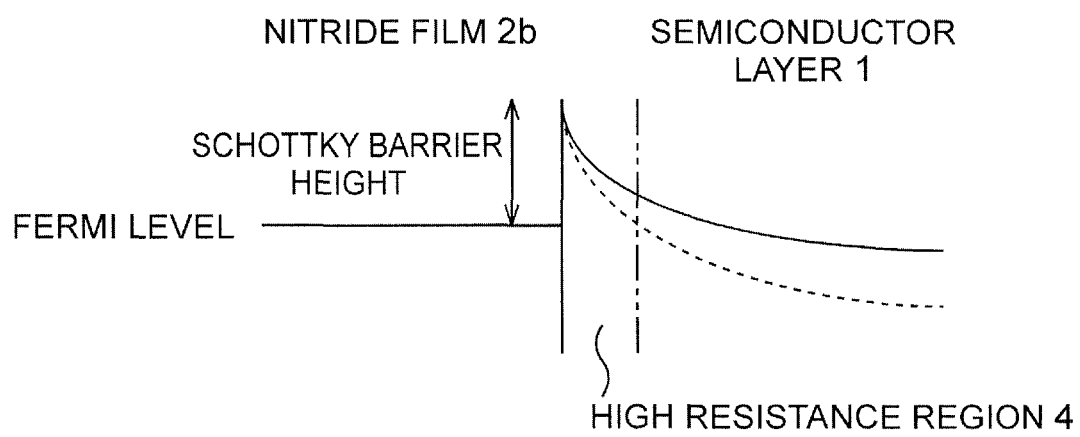
FIG. 3B is a diagram illustrating a relation between conduction bands in the nitride film and the semiconductor layer in the second embodiment.

In the second embodiment configured as described above, since the high resistance region 4 exists, the depletion layer more widely spreads when a reverse bias is applied. Accordingly, as illustrated in FIG. 3B, even when the Schottky barrier height is at the same level as that in the first embodiment, change of the conduction band in the high resistance region 4 and the semiconductor layer 1 is gentler than that in the first embodiment (a broken line in FIG. 3B), resulting in a higher off-breakdown voltage.

(Third Embodiment)

Figure 4:
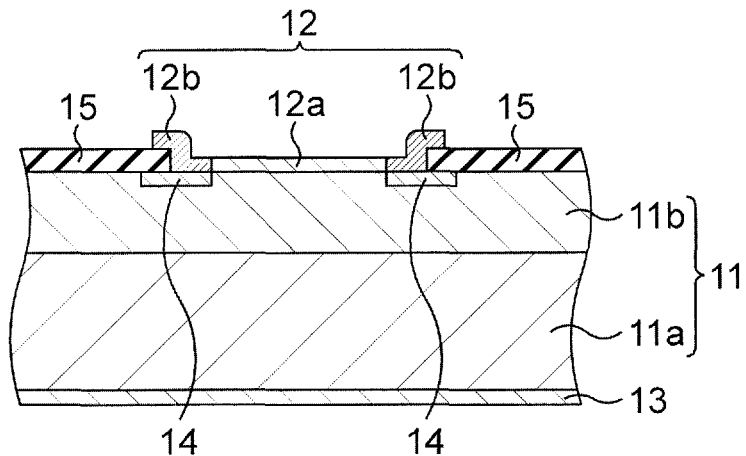
FIG. 4 is a sectional view illustrating a structure of a semiconductor device according to a third embodiment.

Next, a third embodiment will be described. FIG. 4 is a sectional view illustrating a structure of a semiconductor device (Schottky barrier diode) according to the third embodiment.

In the third embodiment, an n-type GaN layer 11b is formed over an n-type GaN substrate 11a as illustrated in FIG. 4. The n-type GaN substrate 11a is doped with, for example, $5 \times 10^{17}$ cm$^{-3}$ Si as an n-type impurity. The n-type GaN layer 11b is doped with, for example, $1 \times 10^{16}$ cm$^{-3}$ Si as an n-type impurity. The thickness of the GaN layer 11b is, for example, about 1 μm. The GaN substrate 11a and the GaN layer 11b are included in a semiconductor layer 11.

A passivation film 15 is formed over the GaN layer 11b. An opening 15a for an anode electrode is formed in the passivation film 15. A silicon nitride film with a thickness of about 400 nm is formed as the passivation film 15, for example.

An anode electrode 12 (Schottky electrode) is formed in the opening 15a. The anode electrode 12 includes a Ti film 12a and a TiN film 12b around the Ti film 12a. A Schottky junction is formed between the GaN layer 11b and the Ti film 12a, and a Schottky junction is formed between the GaN layer 11b and the TiN film 12b. The work function of the TiN film 12b is lower than that of the Ti film 12a. The thicknesses of the Ti film 12a and the TiN film 12b are about 1 μm. An edge portion of the TiN film 12b extends onto the passivation film 15.

A cathode electrode 13 (ohmic electrode) is formed on the rear surface of the GaN substrate 11a. A stacked film of a Ti film with a thickness of about 10 nm and an Al film with a thickness of about 300 nm is formed as the cathode electrode 13, for example.

A high resistance region 14 is formed at a portion of the GaN layer 11b in contact with the TiN film 12b. A resistance of the high resistance region 14 is higher than a resistance of a portion of the GaN layer 11b in contact with the Ti film 12a.

In the third embodiment configured as described above, a Schottky barrier height between the TiN film 12b and the semiconductor layer 11 is higher than a Schottky barrier height between the Ti film 12a and the semiconductor layer 11. Accordingly, when a forward bias is applied, current flows between the Ti film 12a and the semiconductor layer 11 earlier than between the TiN film 12b and the semiconductor layer 11. Therefore, the on-voltage can be decreased. Further, when a reverse bias is applied, a depletion layer extremely widely spreads in the semiconductor layer 11 from the TiN film 12b because of the synergistic effect between the TiN film 12b and the high resistance region 14. Therefore, a sufficient off-breakdown voltage can be obtained. In short, according to the third embodiment, the low on-voltage and the high off-breakdown voltage are compatible.

Next, a method of manufacturing the semiconductor device according to the third embodiment will be described. FIG. 5A to FIG. 5F are sectional views illustrating the method of manufacturing the semiconductor device according to the third embodiment in the process order.

Figure 5A:
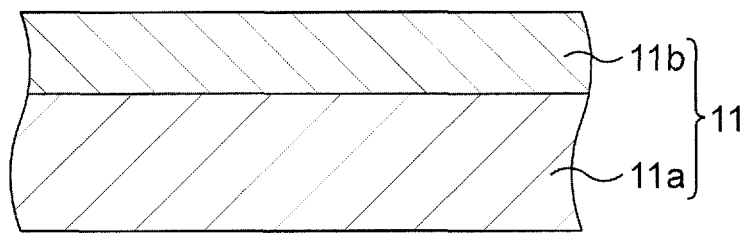
FIG. 5A to FIG. 5F are sectional views illustrating a method of manufacturing the semiconductor device according to the third embodiment in the process order.

First, as illustrated in FIG. 5A, the n-type GaN layer 11b is formed over the n-type GaN substrate 11a. The GaN layer 11b is epitaxially grown, for example, by an MOCVD (metal-organic chemical vapor deposition) method.

Figure 5B:
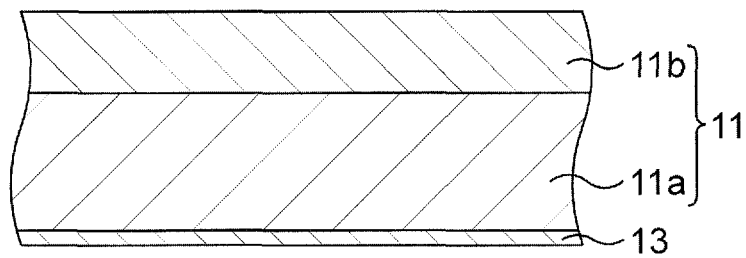

Then, as illustrated in FIG. 5B, the cathode electrode 13 is formed on the rear surface of the GaN substrate 11a. In forming the cathode electrode 13, a Ti film is formed on the GaN substrate 11a, an Al film is formed thereon, by a vapor deposition method, for example, and RTA (rapid thermal annealing) at about 700° C. is performed. The RTA makes ohmic contact.

Figure 5C:
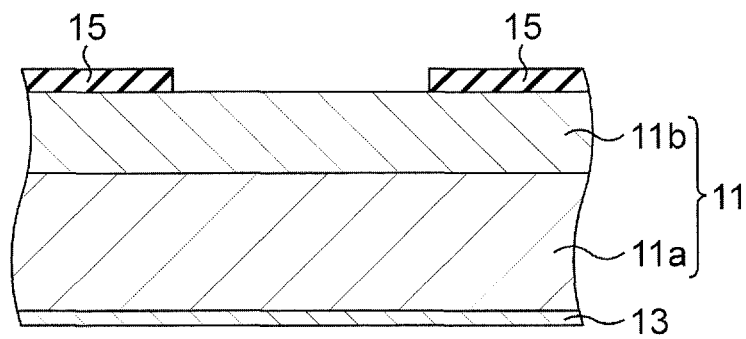

Thereafter, as illustrated in FIG. 5C, the passivation film 15 is formed over the GaN layer 11b, and the opening 15a for the anode electrode is formed in the passivation film 15. A silicon nitride film is formed as the passivation film 15 by a CVD method, for example. In forming the opening 15a, dry etching with a fluorine-based gas is performed, for example.

Figure 5D:
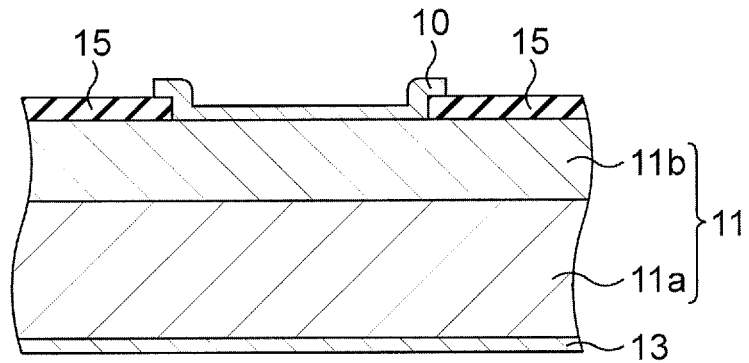

Subsequently, as illustrated in FIG. 5D, the Ti film 10 is formed in the opening 15a while having the edge portion extending onto the passivation film 15. The Ti film 10 may be formed by a lift-off method, for example. More specifically, the Ti film 10 may be obtained in a desired region by forming a resist mask with an opening at a region where the Ti film 10 is to be formed, depositing a Ti film, and removing the resist mask together with the Ti film thereon.

Figure 5E:
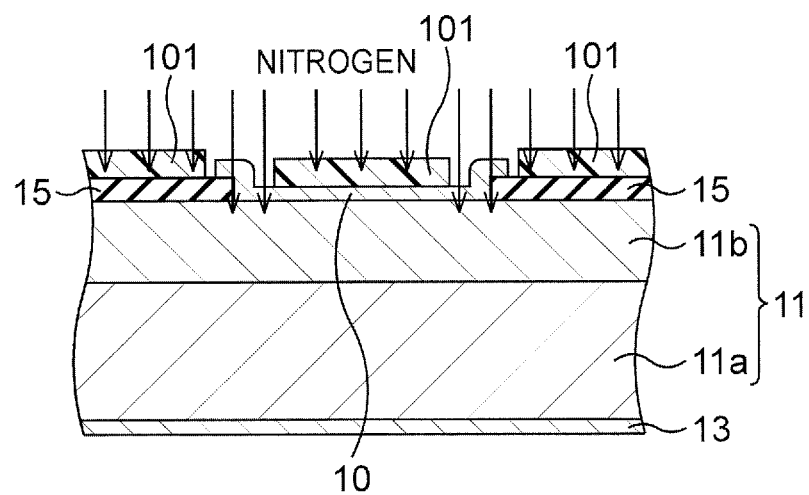

Then, as illustrated in FIG. 5E, a mask 101 is formed which includes an opening at a region where the TiN film 12b is to be formed and at a region where the high resistance region 14 is to be formed, for example, at a peripheral portion of the Ti film 10. A mask of photoresist is formed as the mask 101, for example. Thereafter, nitrogen is ion-implanted into the Ti film 10 and the GaN layer 11b. It is preferable to employ a condition for ion implantation which achieves a peak of implantation depth appearing at an interface between the Ti film 10 and the GaN layer 11b or a point slightly deeper than the interface. Two times of ion implantation may be performed such as an ion implantation by which a peak of implantation depth appears in the Ti film 10 and an ion implantation by which a peak of implantation depth appears in the GaN layer 11b. A condition for ion implantation may be changed, for example, by adjusting acceleration energy.

Figure 5F:
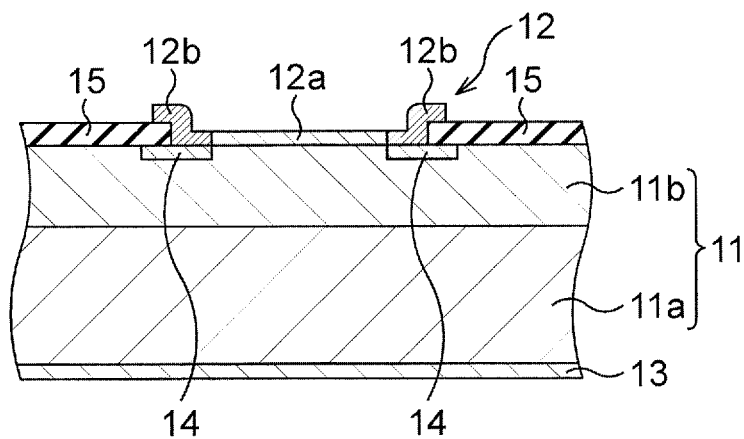

The ion implantation of nitrogen causes a portion of the Ti film 10 implanted with nitrogen to become the TiN film 12b and a portion inside thereof to remain as the Ti film 12a as illustrated in FIG. 5F. Further, a portion of the GaN layer 11b implanted with nitrogen increases in resistance and forms the high resistance region 14. Then, removal of the mask 101 results in the structure illustrated in FIG. 4.

In the manufacturing method, the TiN film 12b is formed by nitridation of the Ti film 10 and the remaining portion of the Ti film 10 is the Ti film 12a. Accordingly, there is no need to form another metal film after forming the Ti film 10, and a cleaning treatment performed before the formation of the Ti film 10 can provide sufficient cleanliness. Accordingly, high reliability can also be ensured.

Plasma processing may be performed instead of the ion implantation at the nitridation of the Ti film 10 and the formation of the high resistance region 14. In other words, processing of exposing a portion exposed from the opening of the mask 101 to $N_2$ plasma.

A Ta film and a TaN film may be used instead of the Ti film and the TiN film. The carrier concentrations in the GaN substrate 11a and the GaN layer 11b and the thickness of the GaN layer 11b and so on may be changed according to the characteristics such as the off-breakdown voltage and the on-resistance and so on desired for the Schottky barrier diode. As the GaN layer 11b, a stack of GaN-based semiconductor (for example, GaN and AlGaN) films may be used.

(Fourth Embodiment)

Figure 6A:
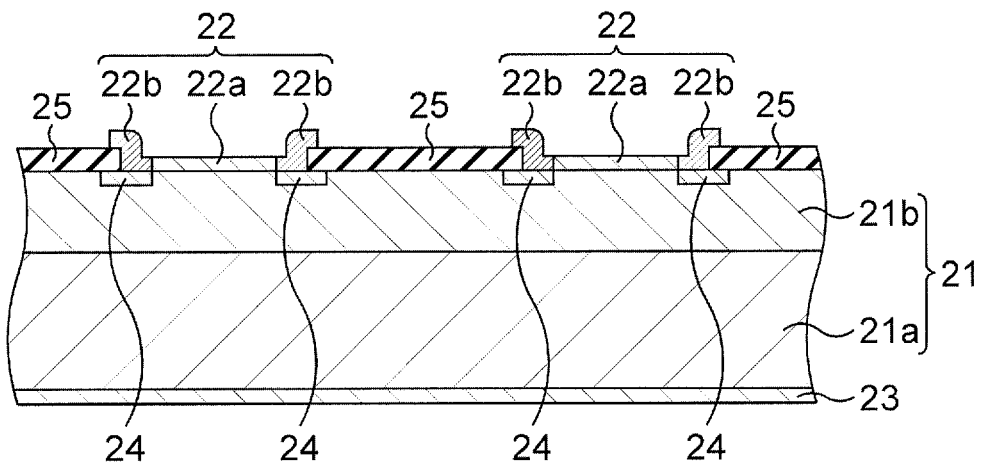
FIG. 6A to FIG. 6C are sectional views illustrating a method of manufacturing a semiconductor device according to a fourth embodiment in the process order.
Figure 6B:
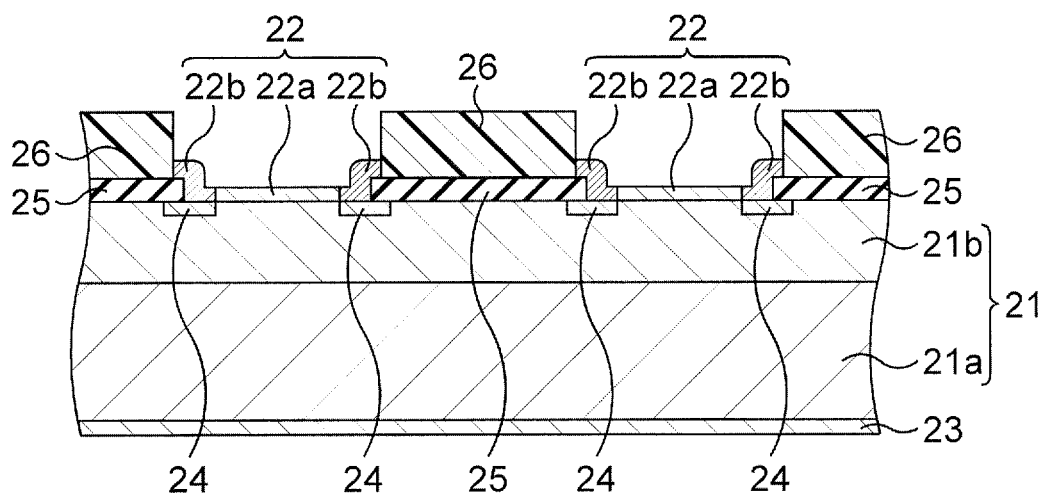
Figure 6C:
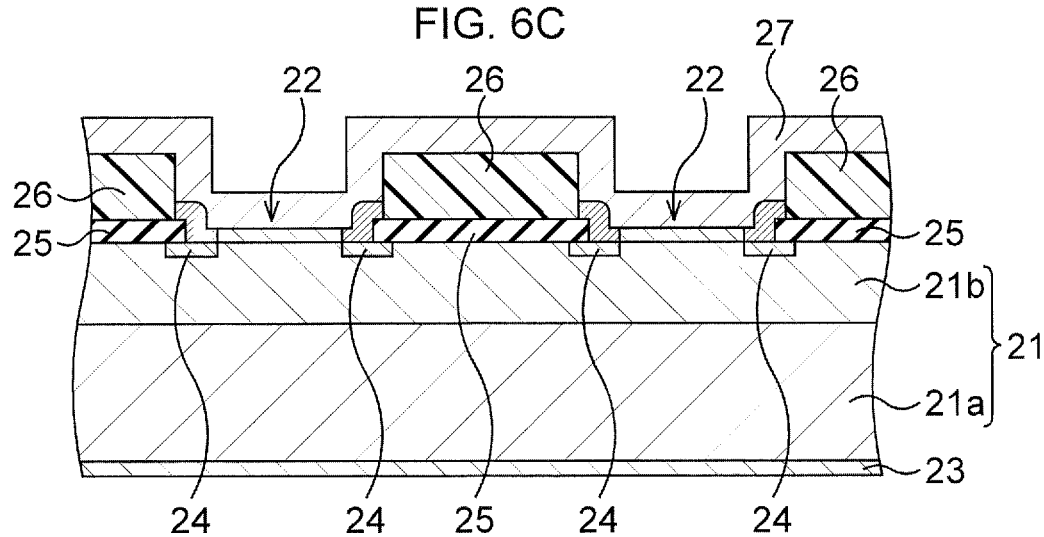

Next, a fourth embodiment will be described. In the fourth embodiment, SBDs are connected in parallel. FIG. 6A to FIG. 6C are sectional views illustrating the method of manufacturing the semiconductor device according to the fourth embodiment in the process order.

First, as illustrated in FIG. 6A, an n-type GaN layer 21b is formed over an n-type GaN substrate 21a as in the third embodiment. The GaN substrate 21a and the GaN layer 21b are included in a semiconductor layer 21. Then, as in the third embodiment, a cathode electrode 23 is formed on the rear surface of the GaN substrate 21a. Thereafter, as in the third embodiment, a passivation film 25 is formed over the GaN layer 21b, and openings 25a for anode electrodes are formed in the passivation film 25. Subsequently, a Ti film having an edge portion extending onto the passivation film 25 is formed in each of the openings 25a, and ion implantation of nitrogen using a mask is performed. As a result, anode electrodes 22 each having a Ti film 22a and a TiN film 22b around the Ti film 22a are formed. A Schottky junction is formed between the GaN layer 21b and each of the Ti films 22a, and a Schottky junction is formed between the GaN layer 21b and each of the TiN films 22b. Further, high resistance regions 24 higher in resistance than portions of the GaN layer 21b in contact with the Ti film 22a are formed at portions of the GaN layer 21b in contact with the TiN film 22b.

Then, as illustrated in FIG. 6B, a polyimide film 26 is formed exposing the Ti film 22a and the TiN film 22b and covering the passivation film 25.

Thereafter, as illustrated in FIG. 6C, an anode wiring 27 commonly connecting the anode electrodes 22 is formed over the polyimide film 26. An Al film with a thickness of about 2 μm is formed as the anode wiring 27, for example.

In mounting the SBD (semiconductor device), the cathode electrode 23 may be die-attached to a portion of a lead frame with an Ag paste or the like, and the anode wiring 27 may be connected to another portion of the lead frame via an Al wire or the like. Also in the third embodiment, the same mounting is possible by forming an anode wiring connected to the anode electrode 12.

(Fifth Embodiment)

Next, a fifth embodiment will be described. In the fifth embodiment, a GaN-based SBD and a GaN-based high electron mobility transistor (HEMT) are formed over a common substrate. FIG. 7A to FIG. 7L are sectional views illustrating the method of manufacturing the semiconductor device according to the fifth embodiment in the process order.

Figure 7A:
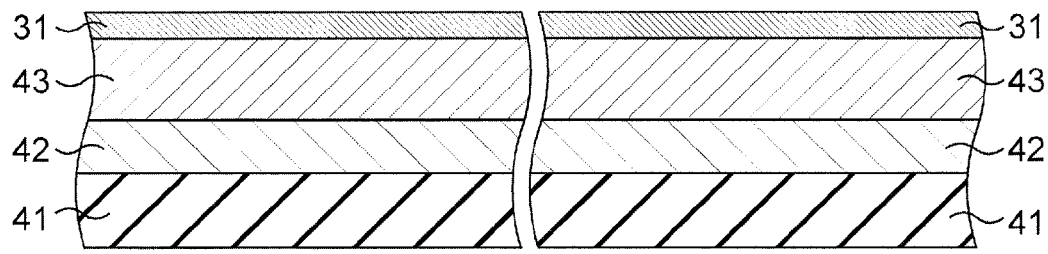
FIG. 7A to FIG. 7L are sectional views illustrating a method of manufacturing a semiconductor device according to a fifth embodiment.

First, as illustrated in FIG. 7A, a buffer layer 42, an i-type i-GaN layer 43, and an n-type n-AlGaN layer 31 are formed over a substrate 41 by an MOCVD method or the like, for example. The i-GaN layer 43 is an intentionally non-doped layer. A semi-insulating SiC substrate, a semi-insulating Si substrate, a sapphire substrate or the like may be used as the substrate 41, for example. A GaN layer or an AlGaN layer with a thickness of about 100 nm is formed as the buffer layer 42, for example. For example, the thickness of the i-GaN layer 43 is about 2 μm and the thickness of the n-AlGaN layer 31 is about 20 nm.

Figure 7B:
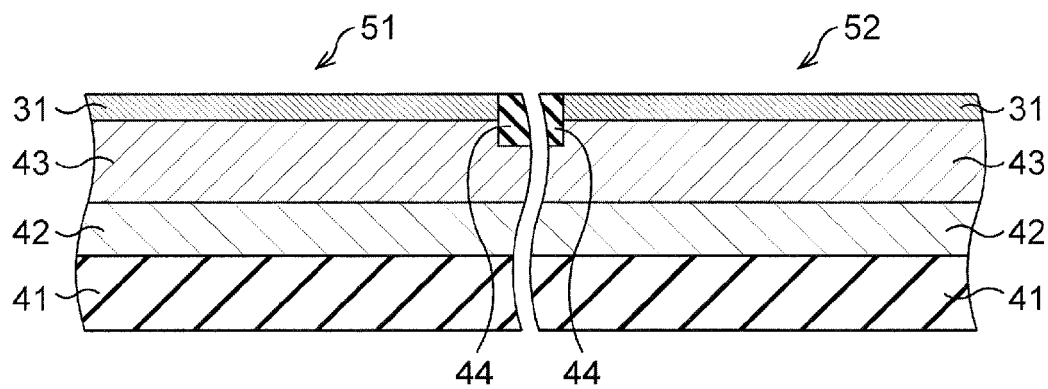

Then, as illustrated in FIG. 7B, an element isolation region 44 is formed which defines a region 51 where a GaN-based HEMT is to be formed and a region 52 where a GaN-based SBD is to be formed. In forming the element isolation region 44, Ar ion may be implanted to a point deeper than a heterojunction interface between the i-GaN layer 43 and the n-AlGaN layer 31, for example. The ion implantation divides two-dimensional electron gas (2DEG) existing at a surface part of the i-GaN layer 43.

Figure 7C:
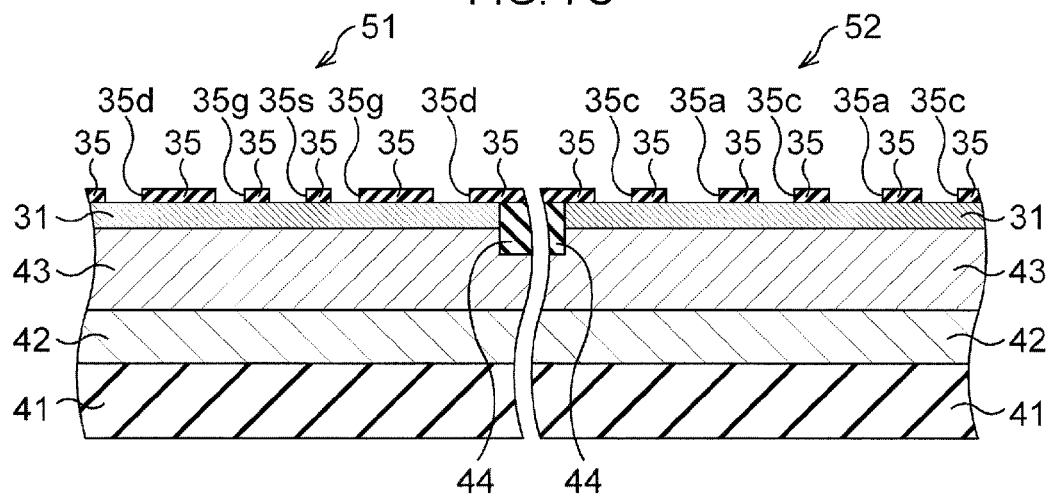

Thereafter, as illustrated in FIG. 7C, a passivation film 35 is formed over the n-AlGaN layer 31, and openings 35a for anode electrodes, openings 35c for cathode electrodes, openings 35g for gate electrodes, openings 35s for source electrodes, and openings 35d for drain electrodes are formed in the passivation film 35. A silicon nitride film with a thickness of about 400 nm is formed by a CVD method as the passivation film 35, for example. In forming the openings 35a, 35c, 35g, 35s and 35d, dry etching with a fluorine-based gas is performed, for example.

Figure 7D:
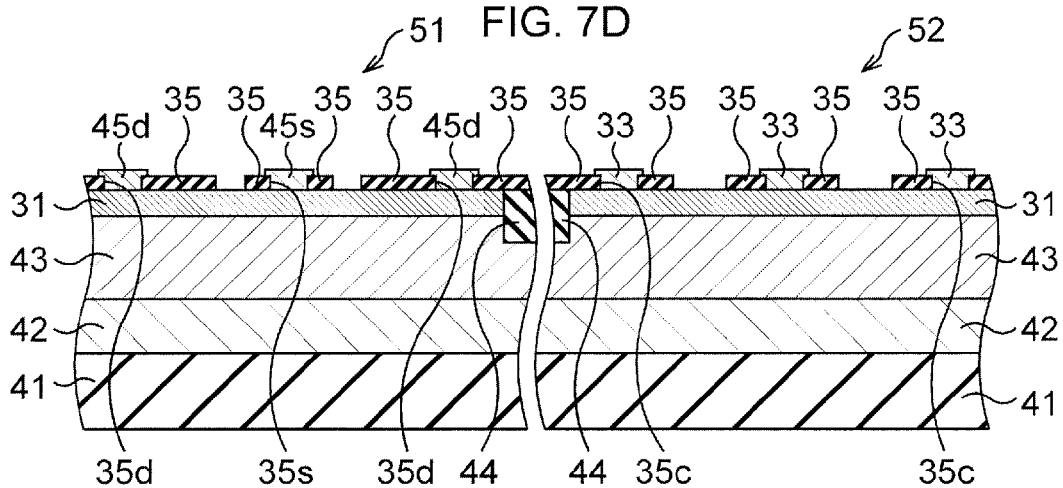

Subsequently, as illustrated in FIG. 7D, cathode electrodes 33 are formed in the openings 35c, source electrodes 45s are formed in the openings 35s, and drain electrodes 45d are formed in the openings 35d. The cathode electrodes 33, the source electrodes 45s and the drain electrodes 45d may be formed by a lift-off method, for example. More specifically, a resist mask with openings at regions where the cathode electrodes 33, the source electrodes 45s and the drain electrodes 45d are to be formed is formed, a Ti film with a thickness of about 10 nm and an Al film with a thickness of about 300 nm are deposited, and the resist mask is removed together with the Ti film and the Al film thereon. Then, RTA at about 700° C. is performed. The RTA makes ohmic contact of the cathode electrodes 33, the source electrodes 45s and the drain electrodes 45d.

Figure 7E:
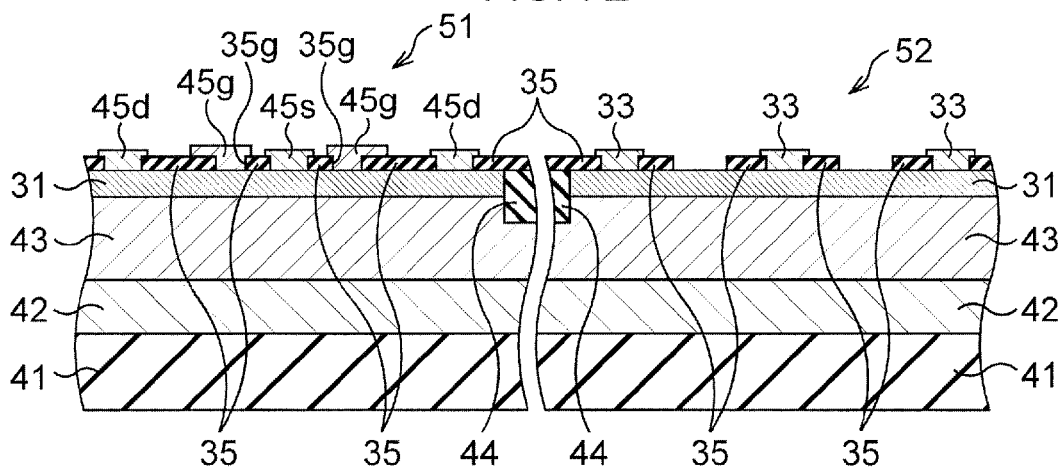

Subsequently, as illustrated in FIG. 7E, gate electrodes 45g are formed in the openings 35g. The gate electrodes 45g may be formed by a lift-off method, for example. More specifically, a resist mask with openings at regions where the gate electrodes 45 are to be formed is formed, a Ni film with a thickness of about 10 nm and an Au film with a thickness of about 200 nm are deposited, and the resist mask is removed together with the Ni film and the Au film thereon.

Figure 7F:
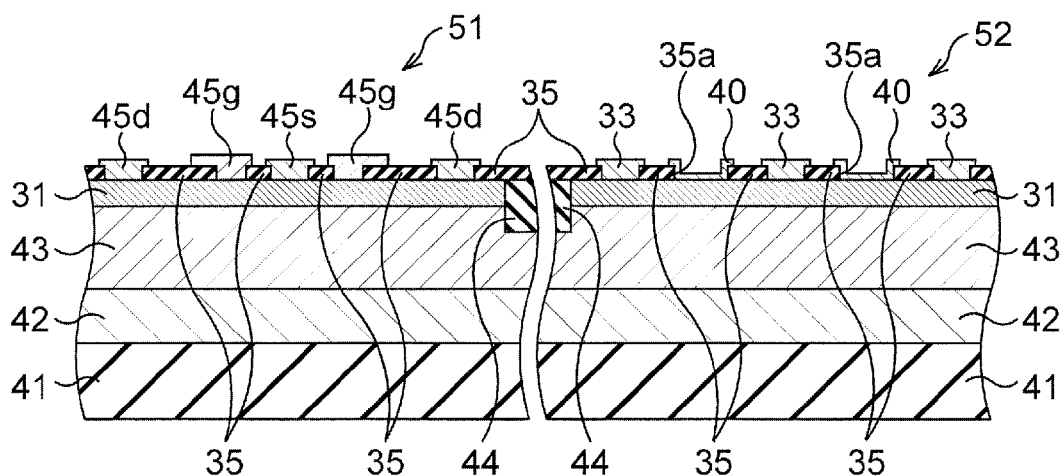

Thereafter, as illustrated in FIG. 7F, Ti films 40 are formed in the openings 35a while having edge portions extending onto the passivation film 35. The Ti films 40 may be formed by a lift-off method, for example. More specifically, the Ti films 40 may be obtained in desired regions by forming a resist mask with openings at regions where the Ti films 40 are to be formed, depositing a Ti film, and removing the resist mask together with the Ti film thereon.

Figure 7G:
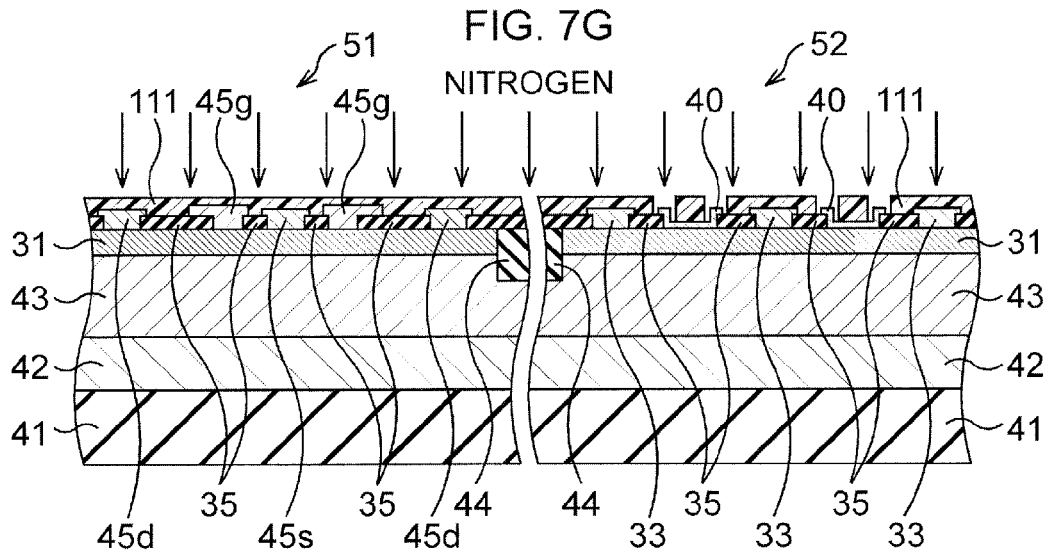

Thereafter, as illustrated in FIG. 7G, a mask 111 is formed which includes an opening in the vicinity of the peripheral edge portions of the Ti films 40. A mask of a photoresist is formed as the mask 111, for example. Subsequently, nitrogen is ion-implanted into the Ti films 40 and the n-AlGaN layer 31 as in the third embodiment.

Figure 7H:
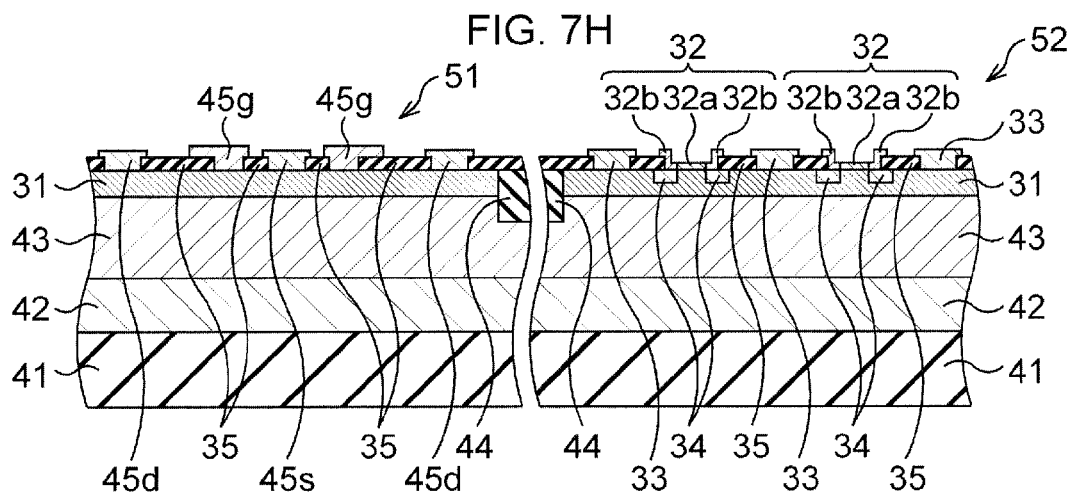

The ion implantation of nitrogen causes portions of the Ti films 40 implanted with nitrogen to become TiN films 32b and portions inside thereof to remain as Ti films 32a as illustrated in FIG. 7H. The Ti film 32a and the TiN film 32b are included in an anode electrode 32. Further, portions of the n-AlGaN layer 31 implanted with nitrogen increase in resistance and form high resistance regions 34.

Figure 7I:
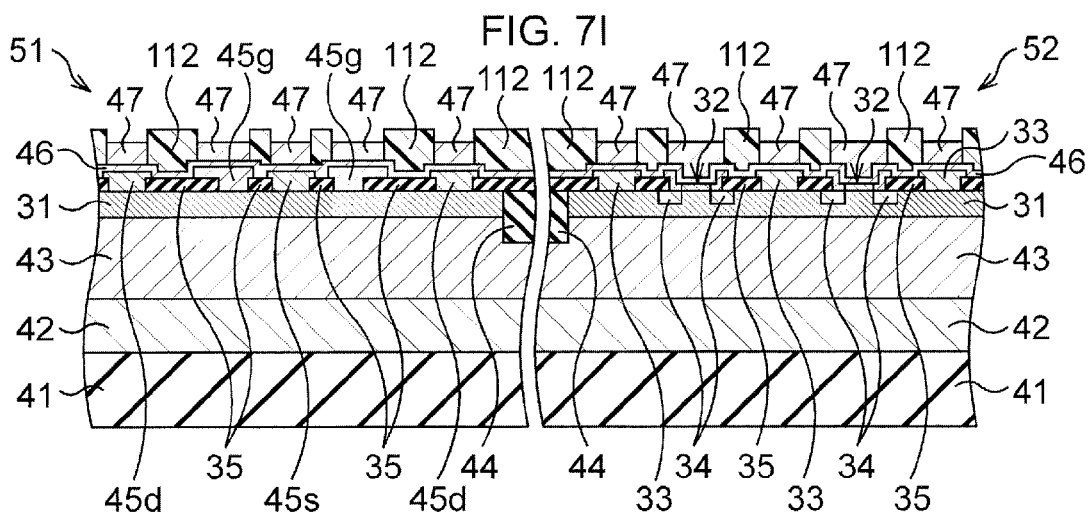

Then, as illustrated in FIG. 7I, an Au seed layer 46 is formed on the entire surface by a sputtering method, for example. Subsequently, a mask (for example, a resist mask) 112 with openings exposing the anode electrodes 32, the cathode electrodes 33, the gate electrodes 45g, the source electrodes 45s, and the drain electrodes 45d is formed over the Au seed layer 46. Then, an Au film 47 with a thickness of about 10 µm is formed by a plating method, for example.

Figure 7J:
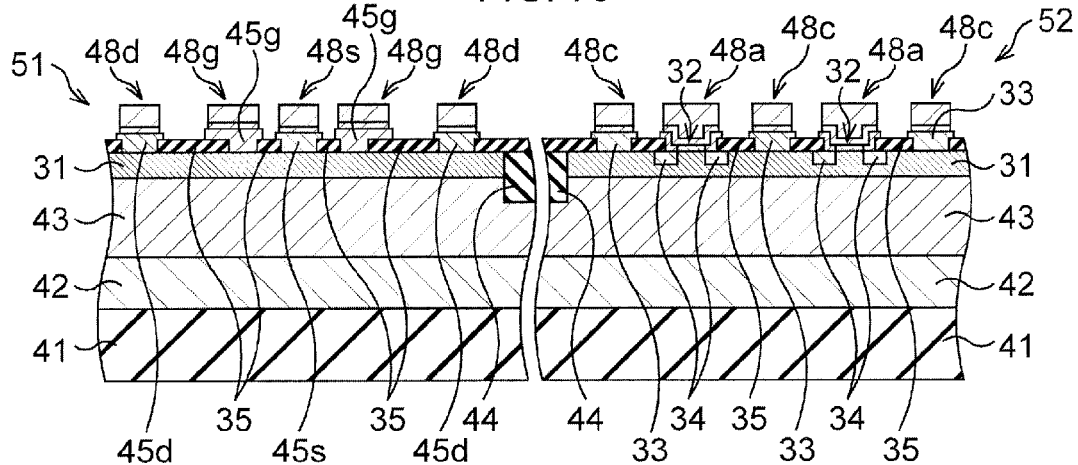

Thereafter, as illustrated in FIG. 7J, the mask 112 is removed, and the Au seed layer 46 exposed from the Au film 47 is removed by an ion milling method or the like. As a result, relay wiring layers 48a connected to the anode electrodes 32, a cathode wiring 48c commonly connecting the cathode electrodes 33, a gate wiring 48g commonly connecting the gate electrodes 45g, relay wiring layers 48s connected to the source electrode 45s, and a drain wiring 48d commonly connecting the drain electrodes 45d are obtained.

Figure 7K:
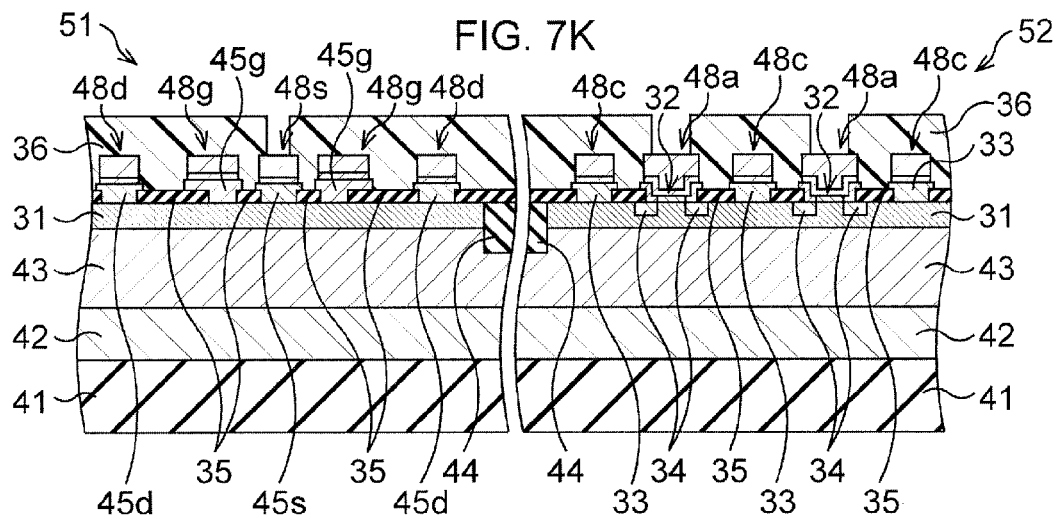

Subsequently, as illustrated in FIG. 7K, a photosensitive polyimide film 36 exposing the relay wiring layers 48a and the relay wiring layers 48s and covering the cathode wiring 48c, the gate wiring 48g and the drain wiring 48d is formed over the passivation film 35.

Figure 7L:
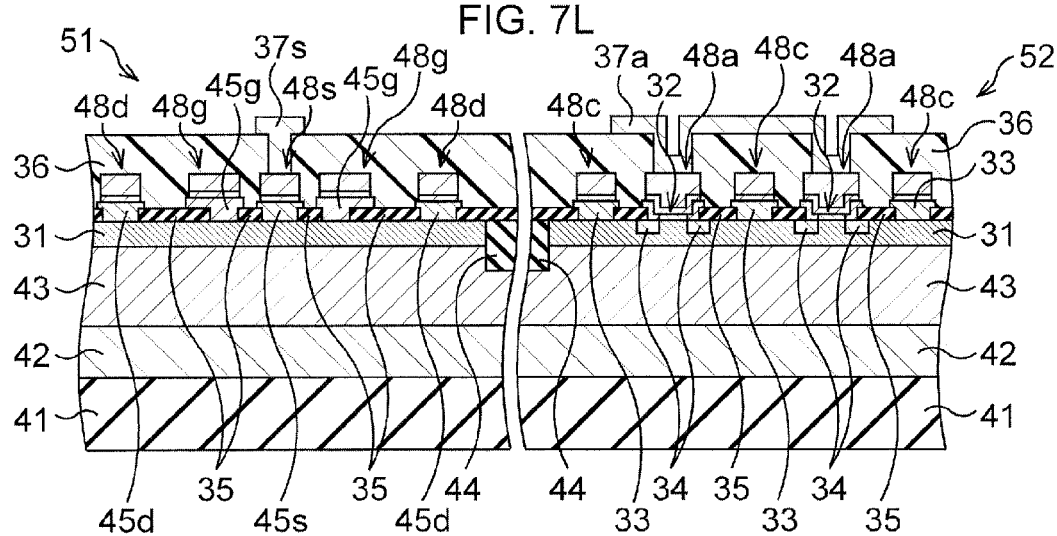

Then, as illustrated in FIG. 7L, an anode wiring 37a commonly connecting the relay wiring layers 48a and a source wiring 37s commonly connecting the relay wiring layers 48s are formed. In forming the anode wiring 37a and the source wiring 37s, for example, an Au seed layer is formed over the entire surface by a sputtering method, a mask, for example, a resist mask exposing the regions where the anode wiring 37a and the source wiring 37s are to be formed is formed, and an Au film with a thickness of about 10 µm is formed by a plating method. Then, the mask is removed, and the Au seed layer exposed from the Au film is removed by an ion milling method or the like.

Thus, a semiconductor device in which the GaN-based SBD and the GaN-based HEMT are formed over a common substrate may be obtained. In the GaN-based HEMT, the i-GaN layer 43 functions as an electron transit layer and the n-AlGaN layer 31 functions as an electron supply layer.

An example of layout of the anode electrodes 32, the cathode electrodes 33, the gate electrodes 45g, the source electrodes 45s, and the drain electrodes 45d is illustrated in FIG. 8A, and an example of layout of the anode wiring 37a, the cathode wiring 48c, the gate wiring 48g, the source wiring 37s, and the drain wiring 48d is illustrated in FIG. 8B.

Figure 9:
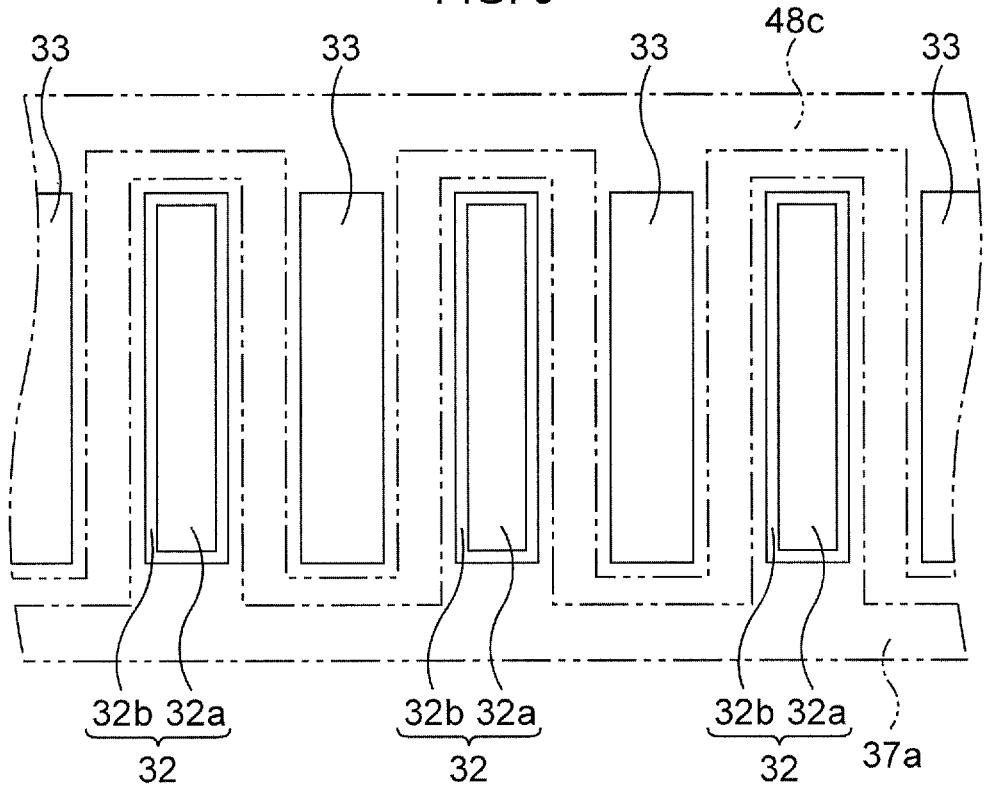
FIG. 9 is a view illustrating a modification example of the layout.

Note that, as illustrated in FIG. 9, the anode wiring 37a and the anode electrodes 32, and the cathode wiring 48c and the cathode electrodes 33 may be laid out in a comb form.

The electrodes of the GaN-based HEMT may be two-dimensionally arrayed like the electrodes of the GaN-based SBD in FIG. 8A. A through hole may be formed in the substrate and the drain wiring of the GaN-based HEMT may be routed around to the rear surface of the substrate via the through hole. Similarly, the cathode wiring of the GaN-based SBD may be routed around to the rear surface. Al (aluminum) more reasonable than Au may be used as the material for the wiring.

In the first to fourth embodiments, the cathode electrodes may be provided on the front surface side of the substrate as in the fifth embodiment.

(Sixth Embodiment)

Figure 10:
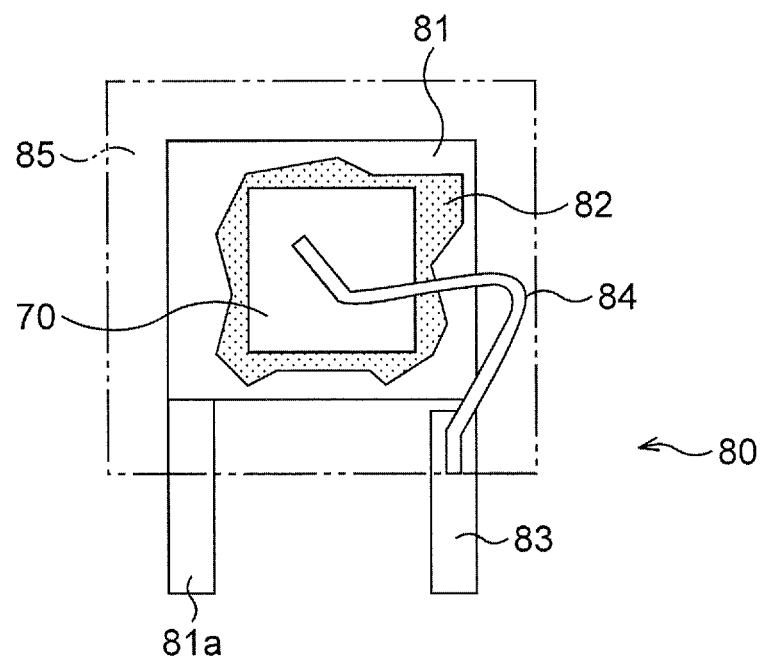
FIG. 10 is a view illustrating an SBD package including a GaN-based SBD.
Figure 11:
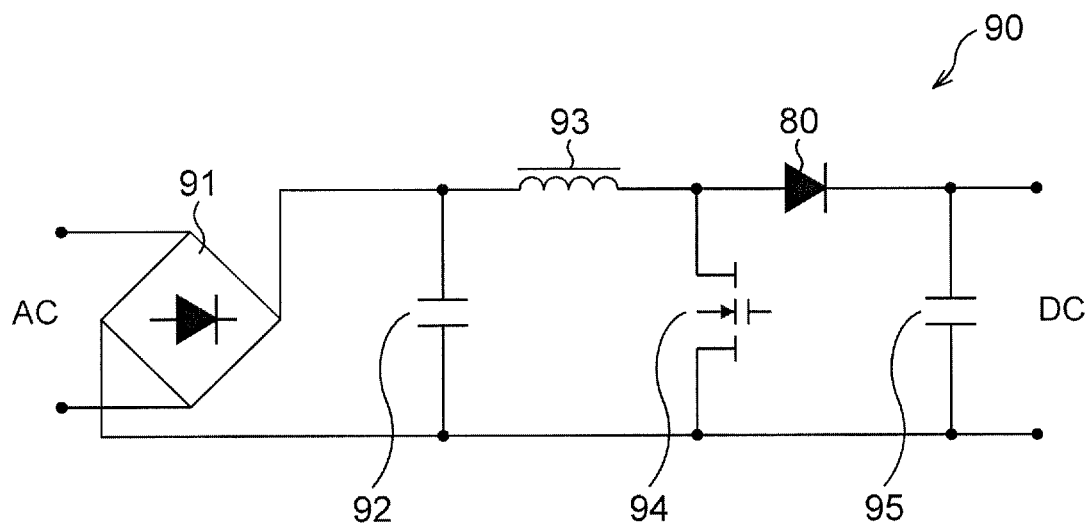
FIG. 11 is a diagram illustrating a PFC circuit including the SBD packaged illustrated in FIG. 10.
Figure 12:
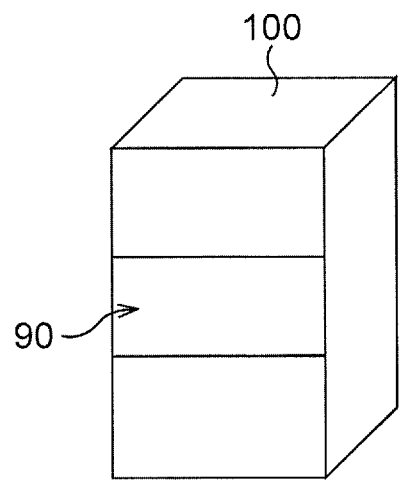
FIG. 12 is a view illustrating a power supply apparatus for server including the PFC circuit illustrated in FIG. 11.

Next, a sixth embodiment will be described. The sixth embodiment is a device such as a power supply apparatus for server including a GaN-based SBD. FIG. 10 is a view illustrating an SBD package including the GaN-based SBD. FIG. 11 is a diagram illustrating a PFC (power factor correction) circuit including the SBD package illustrated in FIG. 10. FIG. 12 is a view illustrating a power supply apparatus for server including the PFC circuit illustrated in FIG. 11.

As illustrated in FIG. 10, a cathode electrode of a GaN-based SBD 70 is fixed to a package electrode base 81 with a mounting material 82 such as solder in an SBD package 80 including the GaN-based SBD 70. A lead 81a is connected to the package electrode base 81. An anode electrode of the GaN-based SBD 70 is connected to another lead 83 by bonding with an Al wire 84. These elements are sealed with a mold resin 85.

In a PFC circuit 90 including the SBD package 80, one terminal of a choke coil 93 and one terminal of a switch element 94 are connected to the lead 83 connected to the anode electrode of the GaN-based SBD 70, and one terminal of a capacitor 95 is connected to the lead 81a connected to the cathode electrode, as illustrated in FIG. 11. A capacitor 92 is connected to the other terminal of the choke coil 93. The other terminal of the capacitor 92, another terminal of the switch element 94, and the other terminal of the capacitor 95 are grounded. An alternating current power source (AC) is connected to the capacitor 92 via a diode bridge 91. Further, a direct-current power source (DC) is taken out from both terminals of the capacitor 95.

Then, the PFC circuit 90 is assembled in a power supply apparatus for server 100 or the like as illustrated in FIG. 12.

As in the power supply apparatus for server 100, a power supply apparatus with higher reliability, for example, a DC-DC converter, an AC-DC converter and the like can also be constructed.

In the embodiments, another nitride semiconductor layer such as an AlGaN layer may be used instead of all or part of the GaN layer in the Schottky barrier diode.

According to the above semiconductor device and the like, an on-voltage can be decreased by the metal part included in the Schottky electrode, and an off-breakdown voltage can be improved by the nitride part.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
    a semiconductor layer; and
    a Schottky electrode, a Schottky junction being formed between the semiconductor layer and the Schottky electrode,
    wherein the Schottky electrode comprises:
        a metal part containing a metal, the metal part being in direct contact with the semiconductor layer, and a Schottky junction being formed between the semiconductor layer and the metal part; and
        a nitride part around the metal part, the nitride part containing a nitride of the metal, the nitride part being in direct contact with the semiconductor layer, and a Schottky junction being formed between the semiconductor layer and the nitride part, wherein
    the metal part and the nitride part are in direct contact with each other.

2. The semiconductor device according to claim 1, wherein a first resistance of a first portion of the semiconductor layer in contact with the nitride part is higher than a second resistance of a second portion of the semiconductor layer in contact with the metal part.

3. The semiconductor device according to claim 1, wherein the metal is Ti or Ta.

4. The semiconductor device according to claim 1, wherein the semiconductor layer contains a nitride semiconductor.

5. The semiconductor device according to claim 1, wherein the semiconductor layer comprises:
    an electron transit layer; and
    an electron supply layer over the electron transit layer.

6. The semiconductor device according to claim 1, further comprising:
    a substrate over which the Schottky electrode is provided;
    a second Schottky electrode provided over the substrate, a Schottky junction being formed between the semiconductor layer and the second Schottky electrode; and
    a wiring connecting the Schottky electrode and the second Schottky electrode,
    wherein the second Schottky electrode comprises:
        a second metal part containing a second metal, a Schottky junction being formed between the semiconductor layer and the second metal part; and
        a second nitride part around the second metal part, the second nitride part containing a nitride of the second metal, and a Schottky junction being formed between the semiconductor layer and the second nitride part.

7. A power supply apparatus, comprising:
    a semiconductor device,
    wherein the semiconductor device comprises:
        a semiconductor layer; and
        a Schottky electrode, a Schottky junction being formed between the semiconductor layer and the Schottky electrode,
        wherein the Schottky electrode comprises:
            a metal part containing a metal, the metal part being in direct contact with the semiconductor layer, and a Schottky junction being formed between the semiconductor layer and the metal part; and
            a nitride part around the metal part, the nitride part containing a nitride of the metal, the nitride part being in direct contact with the semiconductor layer, and a Schottky junction being formed between the semiconductor layer and the nitride part, wherein
        the metal part and the nitride part are in direct contact with each other.

8. The power supply apparatus according to claim 7, wherein a first resistance of a first portion of the semiconductor layer in contact with the nitride part is higher than a second resistance of a second portion of the semiconductor layer in contact with the metal part.

9. The power supply apparatus according to claim 7, wherein the metal is Ti or Ta.

10. The power supply apparatus according to claim 7, wherein the semiconductor layer contains a nitride semiconductor.

11. The power supply apparatus according to claim 7, wherein the semiconductor layer comprises:
    an electron transit layer; and
    an electron supply layer over the electron transit layer.

12. The power supply apparatus according to claim 7, further comprising:
    a substrate over which the Schottky electrode is provided;
    a second Schottky electrode provided over the substrate, a Schottky junction being formed between the semiconductor layer and the second Schottky electrode; and
    a wiring connecting the Schottky electrode and the second Schottky electrode,
    wherein the second Schottky electrode comprises:
        a second metal part containing a second metal, a Schottky junction being formed between the semiconductor layer and the second metal part; and
        a second nitride part around the second metal part, the second nitride part containing a nitride of the second metal, and a Schottky junction being formed between the semiconductor layer and the second nitride part.

13. A manufacturing method of a semiconductor device, comprising:
    forming a metal film, a Schottky junction being formed between a semiconductor layer and the metal film; and
    nitriding a peripheral portion of the metal film to form a metal part and a nitride part around the metal part from the metal film, the metal part being in direct contact with the semiconductor layer, the nitride part being in direct contact with the semiconductor layer, the metal part and the nitride part being in direct contact with each other., a Schottky junction being formed between the semiconductor layer and the metal part, and a Schottky junction being formed between the semiconductor layer and the nitride part.

14. The manufacturing method according to claim 13, wherein nitriding the peripheral portion to form the metal part and the nitride part comprises performing ion implantation of nitrogen to the peripheral portion or exposing the peripheral portion to nitrogen plasma.

15. The manufacturing method according to claim 13, further comprising making a first resistance of a first portion of the semiconductor layer in contact with the nitride part higher than a second resistance of a second portion of the semiconductor layer in contact with the metal part.

16. The manufacturing method according to claim 13, wherein the metal film contains Ti or Ta.

17. The manufacturing method according to claim 13, wherein the semiconductor layer contains a nitride semiconductor.

18. The manufacturing method according to claim 13, wherein the semiconductor layer comprises:
an electron transit layer; and
an electron supply layer over the electron transit layer.

19. The manufacturing method according to claim 13, wherein
metal films are formed over a substrate in forming the metal film, and
the method further comprises forming a wiring connecting metal parts and nitride parts formed from the metal films.

20. The manufacturing method according to claim 15, wherein making the first resistance higher than the second resistance is performed with a time period in nitriding the peripheral portion to form the metal part and the nitride part.

* * * * *